United States Patent [19]

Lo

[11] 4,186,355
[45] Jan. 29, 1980

[54] SEMICONDUCTOR DIODE LASER WITH INCREASED FREQUENCY TUNING RANGE

[75] Inventor: Wayne Lo, Troy, Mich.

[73] Assignee: General Motors Corporation, Detroit, Mich.

[21] Appl. No.: 892,188

[22] Filed: Mar. 31, 1978

[51] Int. Cl.² ............................................. H01S 3/19
[52] U.S. Cl. ............................ 331/94.5 H; 29/569 L; 357/18; 357/90
[58] Field of Search .................... 331/94.5 H; 357/17, 357/18, 61, 90; 29/569 L, 576 R

[56] References Cited

PUBLICATIONS

W. Lo et al., "Ingot-Nucleated $Pb_{1-x}Sn_xTe$ Diode Lasers," Journal of Applied Physics, vol. 47, No. 1, pp. 267-271, Jan. 1976.
W. Lo, "Tellurium-Rich Growth and Laser Fabrication of Lead-Tin-Telluride," Journal of Electronic Materials, vol. 6, No. 1, pp. 39-48, Jan. 1977.
W. Lo, "Cd-Diffused $Pb_{1-x}Sn_xTe$ Lasers with High Output Power," Applied Physics Letters, vol. 28, No. 3, pp. 154-156, Feb. 1976.
Dionne et al., "Optical Properties of Some $Pb_{1-x}Sn_xTe$ Alloys . . . ," Physical Review B, vol. 6, No. 10, Nov. 15, 1972, pp. 3898-3913.
G. A. Autcliffe et al., "Characteristics of Tunable $Pb_{1-x}Sn_xTe$ Junction Lasers in the 8-12-$\mu$m Region," J. Appl. Phys., vol. 44, No. 9, Sep. 1973, pp. 4145-4160.

Primary Examiner—James W. Davie
Attorney, Agent, or Firm—Robert J. Wallace

[57] ABSTRACT

A semiconductor diode laser tunable within a range of over 200 wave numbers. Increased tuning range of a lead-salt laser, from about 30 to over 200 wave numbers, is attained by providing an increasing majority carrier concentration in the laser crystal within the laser cavity in the direction extending away from the contiguous PN junction contiguous the laser cavity.

7 Claims, 3 Drawing Figures

SEMICONDUCTOR DIODE LASER WITH INCREASED FREQUENCY TUNING RANGE

BACKGROUND OF THE INVENTION

This invention relates to semiconductor diode lasers, and more particularly to a lead-salt diode infrared laser having a substantially increased frequency tuning range. It also involves an improved method of making such a laser.

A semiconductor diode laser is usually formed in a monocrystalline semiconductor body having a PN junction and two mutually parallel reflective faces that are perpendicular to the PN junction. The semiconductor body is usually a rectangular parallelepiped, and the reflective surfaces form a laser cavity adjacent one side of the PN junction. However, the cavity does not have to be formed in a rectangular parallelepiped body, or even in a body with flat parallel faces. Ring-type lasers, cylindrical lasers, and others are known.

The lasing action is produced by applying a forward bias voltage across the PN junction. The forward bias injects electrons across the PN junction to stimulate emission of radiation. Above a given level of electron injection, called threshold current ($J_{TH}$), emitted radiation is collected and amplified in the laser cavity. The amplified radiation exits the laser cavity parallel the PN junction as a monochromatic and coherent beam. The radiation wavelength emitted by a laser is essentially a function of the semiconductor band gap. Composition of the semiconductor material primarily determines the band gap. However, composition is not the only factor which affects band gap. Laser body operating temperature, injection current, magnetic fields and pressures also affect the band gap. They can be used to precisely adjust the principal active radiation mode of a laser to a preselected wavelength. Such adjustment is referred to herein as tuning.

Semiconductor diodes will function as lasers at very low temperatures. For example, lead-salt lasers commence lasing action at only a few degrees Kelvin. As laser temperature increases, so does the frequency of the radiation which is emitted. On the other hand, electrical and/or radiation losses also increase with increasing temperature. As a result the threshold current ($J_{TH}$) also increases with increasing temperature. The threshold current, as mentioned above, is the current level at which lasing action commences. Such losses in efficiency not only reduce laser output power but also require higher input power to initiate lasing action. At some point the progressively increasing losses become so large that lasing action will not even start. Accordingly, attempts have been made to reduce some of these losses, as for example by growing higher quality crystals, improving crystal processing to maintain high quality, providing lower resistance ohmic contacts, providing better laser cavities, and better heat sinking of the laser body.

In my jointly authored paper Lo et al, "IngotNucleated $Pb_{1-x}Sn_xTe$ Diode Lasers", *J. of App. Physics*, v 47, n 1, pp 267-271 (January 1976) a method of making higher quality lead-salt crystals for lasers is described. In a later paper, Lo, "Tellurium-Rich Growth and Laser Fabrication of Lead-Tin-Telluride", *J. of Electronic Materials*, v 6, n 1, pp 39-48 (January 1977), I describe growing high conductivity P-type lead-salt crystals and making improved lasers with such crystals. Lead-tin-telluride lasers were made using the cadmium diffusion process described in my paper "Cd-Diffused $Pb_{1-x}Sn_xTe$ Lasers with High Output Power", *App. Phys. Letters*, v 28, n 3, pp 154-156 (February 1976) and covered by my U.S. Pat. No. 4,064,621 Lo.

I have now found how to improve semiconductor diode lasers even further, especially lead-salt diode lasers. I have found that if the lead-salt laser cavity has an increasing majority carrier concentration in a direction extending away from the PN junction, lower threshold voltages and increased frequency tuning range can be obtained. I have found that a graded majority current carrier concentration can improve homojunction lead-tin-telluride diode lasers to provide threshold voltages that are significantly less than heterojunction lead-salt diode lasers. I believe that a principal effect of the graded carrier concentration is to provide improved optical confinement with the laser cavity. I also believe that improved optical confinement is attributable to an increasing index of refraction in the semiconductor crystal in a direction extending away from the PN junction of the laser cavity. Such improved lasers and a method for making them are hereinafter more fully described. They are also described in my paper, Lo, "Homojunction Lead-TinTelluride Diode Lasers with Increased Frequency Tuning Range", *IEEE J. of Quantum Electronics*, v QE-13, n 8, pp 591-595 (August 1977).

OBJECTS AND SUMMARY OF THE INVENTION

It is, therefore, a principal object of this invention to provide an improved semiconductor diode laser and method of making same.

Another object of this invention is to provide an improved lead-salt diode laser, particularly a homojunction diode laser, and method of making such a laser.

These and other objects of the invention are attained in a semiconductor diode laser tunable within a range of over 200 wave numbers. Increased tuning range of a lead-salt laser, from about 30 to over 200 wave numbers, is attained by providing a PN junction and a contiguous-type laser cavity form a semiconductor monocrystal, wherein the PN junction is generally uniformly spaced close to the surface of the monocrystal that is cooled during laser operation. The laser cavity is disposed along the PN junction opposite from this cooled surface. The monocrystal is unique in that the portion of it containing the laser cavity has a non-homogeneous majority current carrier concentration generally normal to the PN junction, effective to significantly increase the frequency range within which the laser is tuned. In a preferred embodiment, the majority current carrier concentration of the laser cavity continually increases with increasing distance from the PN junction.

BRIEF DESCRIPTION OF THE DRAWING

Other objects, features and advantages of the invention will become more apparent from the following description of preferred embodiments thereof and from the drawing, in which.

Figure 1:
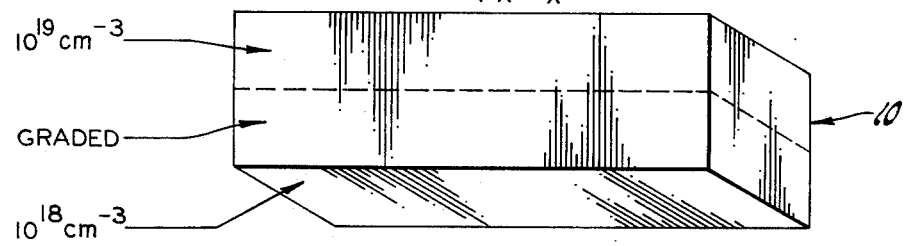
FIG. 1 is an isometric view of a rectangular parallelepiped lead-salt semiconductor monocrystal from which a laser is to be formed.

DESCRIPTION OF THE PREFERRED EMBODIMENTS:

FIG. 1 shows a lead-salt monocrystal of the lead-tin-telluride type, as for example $Pb_{1-x}Sn_xTe$. x may vary from 0 to 0.3 but preferably between .05 and 0.2. In this particular example x is approximately 0.08. The monocrystal was produced by ingot nucleated ampoule growth such as described in my jointly authored January, 1976 *J. of App. Phys.* paper previously referred to, using a tellurium-rich atmosphere such as described in my January, 1977 *J. of Electronic Materials* paper, also previously referred to. A polycrystalline ingot of $Pb_{1-x}Sn_xTe$ (x=0.065), enriched with an excess of about 0.01% by weight tellurium, was sealed within a generally cylindrical quartz ampoule evacuated to about $10^{-6}$ Torr. The ampoule was about 15 centimeters long and had an inner diameter of approximately 15 millimeters. The ampoule was maintained at a temperature of approximately 825° C. for about 12 to 14 days to produce monocrystals nucleated on the source ingot crystal itself. A tellurium enrichment of 0.01–0.1 % by weight can be used to grow satisfactory crystals.

After crystals of sufficient size were grown, the ampoule was cooled from the 825° C. growth temperature to room temperature at a cooling rate of about 6° C. per hour. This produced a P-type majority carrier concentration on the as-grown facets of the cooled crystal of the order of $10^{18}$ carriers per cubic centimeter. However, this cooling rate was not slow enough to equilibrate the crystal interior, i.e. bulk crystal, to the lower carrier concentration level. The bulk crystal remained at a carrier concentration of approximately $10^{19}$ carriers per cubic centimeter. More specifically, with increasing distance below a facet surface, down to a depth of about 100 to 150 micrometers, the majority current carrier concentration continuously gradually increased. At greater depths, it remained constant at about $10^{19}$ carriers per cubic centimeter. Previously, I made lasers from the bulk crystal material, which I now recognize produced a homogeneous carrier concentration in the laser's active region.

In this invention, a slice of such a crystal was cut parallel to a (100) as-grown facet for preparation of a laser body. Such a slice 10 is shown in FIG. 1, with the as-grown facet surface being the lower surface. A PN junction was formed parallel the facet surface within the graded carrier concentration region by diffusing antimony into the as-grown facet surface, using a two hour antimony vapor diffusion at 600° C. The as-grown facet surface was converted to N-type conductivity. The resulting PN junction was approximately 8 micrometers below the as-grown facet surface and substantially parallel the facet surface. It thus formed an active region well within the graded concentration region of the crystal. After antimony diffusion, the wafer was thinned to a thickness of approximately 250 micrometers. It was thinned by lapping the non-diffused surface, which also removed saw marks. This lapped surface was then plated with platinum and then with indium to form a low resistance ohmic contact to the P-type material. The antimony diffused surface was plated only with indium to obtain a low resistance, or ohmic, contact to its N-type surface.

The wafer was then cleaved into 0.8 millimeter wide bars. The cleaved sides of the bars were first lapped flat with 1 micrometer alumina and then polished in hydrobromic acid containing 5 % bromine, to form the laser end faces. The bars were cleaved on their ends to form the rectangular parallelepipeds 10a shown in FIGS. 2 and 3, which had typical dimensions on the side of 250 micrometers and 400 micrometers. 11 of the surfaces were parallel to the (100) facets of the lead-tin-telluride monocrystal.

N-type diffusion regions should be thin to leave a substantial portion of the resultant laser cavity within the graded majority carrier concentration region of the crystal and dispose the PN junction close to the surface which will be cooled. For best results the N-type region should be less than about 20 micrometers deep, preferably 5–15 micrometers deep. It need not be formed by the antimony diffusion hereinbefore described. It can be formed in any suitable manner, and it may be preferred to use the low temperature cadmium diffusion process described and claimed in my U.S. Pat. No. 4,064,621.

Figure 2:
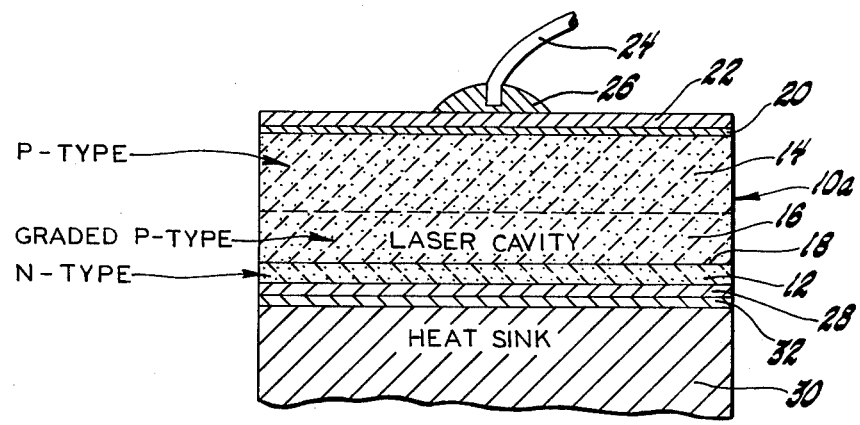
FIG. 2 is a cross-sectional view of a semiconductor diode laser made from the monocrystal of FIG. 1.
Figure 3:
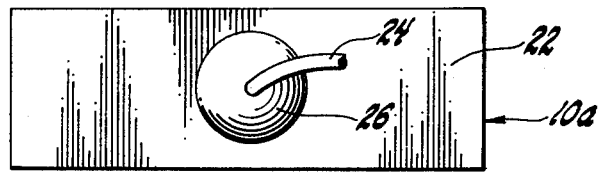
FIG. 3 is a plan view showing the diode laser of FIG. 2.

Reference is now specifically made to FIGS. 2 and 3. As can be seen, the laser body is a rectangular parallelepiped 10a having an N-type region 12 contiguous its lower surface, a P-type region 14 contiguous its upper surface, and a graded concentration P-type region 16 therebetween. A PN junction 18 separates graded concentration P-type region 16 and N-type region 12. As previously discussed, PN junction 18 is parallel the lower surface of body 10a. Hence, it intersects the sides of the laser body 10a. Also as mentioned, P-type region 16 continuously increases in majority current carrier concentration with increasing distance away from the PN junction 18. At the PN junction 18 it has a majority carrier concentration of the order of $10^{18}$ carriers per cubic centimeter, uniformly increasing to the order of $10^{19}$ carrier per cubic centimeter at P-type region 14 about 100–150 micrometers from the lower surface of body 10a. Region 14 has a uniform majority carrier concentration of the order of $10^{19}$ carriers per cubic centimeter and is parallel the upper and lower surfaces of body 10a. The graded P-type region 16 thus forms a laser cavity. It contains an active region about 20–40 micrometers thick contiguous the PN junction 18. This active region is well within the graded concentration region 16, to provide the benefits of this invention.

Body 10a has a 0.1 micrometer thick platinum coating 20 on the top surface with a 2 micrometer thick indium coating 22 on the platinum coating. A silver terminal wire 24 is soldered to the indium coating 22 by means of a drop 26 of indium. The bottom surface of the laser monocrystal has an indium coating 28 about 2 micrometers thick. The plated laser body 10a is soldered to a copper heat sink 30 by means of an interjacent layer 32 of indium about 500 micrometers thick. The heat sink is preferably gold plated (not shown). It is secured within a housing of a closed cycle refrigerator or a cryogenic dewar (not shown) in the usual manner for operation at cryogenic temperatures, as for example about 10° Kelvin. The specific temperature of the laser body during operation would of course be varied from this temperature, depending on the specific wavelength of radiation which is desired.

As with other semiconductor diode lasers, body 10a need not be made in the shape of a rectangular parallelepiped. This invention can be used in making lasers of other shapes, as for example mesas, rings, cylinders, etc. Analogously, the stoichiometry of the $Pb_{1-x}Sn_xTe$ composition can be varied in my invention as in any other lead-tin-telluride lasers. The composition, of course, would be varied to obtain a predetermined band gap energy range commensurate with the range and radiation wavelength within which the laser is to be tuned. It is known that x may vary from 0 to as high as 30 mole percent.

It is believed that the graded majority carrier concentration in the laser cavity produces a graded index of refraction, which in turn provides greater photon confinement within the laser cavity. Accordingly, fewer photons are lost by adsorption outside the 20-40 micrometer thick active region. In addition, the lower carrier concentration on the P side of the PN junction is believed to contribute to a higher injection efficiency and an attendant lower threshold current density. This allows the laser to be operated at higher current levels. It is also believed that the more effective heat sinking due to the shallow PN junction contributes to an increased frequency tuning range.

I have described how these effects can be obtained in homojunction lasers of the lead-tin-telluride type. Most recent results indicate that even wider tunability is obtainable by incorporating this invention in homojunction lasers of the lead-sulfide-selenide type. Further, it now appears that all lead-salt semiconductors, including leadgermanium-telluride, exhibit a significant change in index of refraction with change in majority current carrier concentration. It is believed that this invention is useful in making lasers from all lead-salt semiconductor materials. Further, it is believed that this invention can be applied to heterojunction lead-salt diode lasers, as well as to homojunction lead-salt diode lasers. Molecular beam epitaxy techniques can be used to form a heterojunction diode laser. In such techniques, the semiconductive material can readily be doped during deposition to provide the appropriate majority current carrier concentration gradient in the laser active region to produce the enhanced lasing action of this invention.

The thickness of the parallelepiped body should generally be about 250 micrometers and not appreciably greater, to obtain lowest series resistance between the upper and lower plated surfaces. This also provides more effective crystal cooling. The specific length of the laser body will, of course, vary depending upon the wavelength of radiation to which the laser is to be tuned. As usual, the laser cavity length should be a multiple of ½ of the wave number to which the laser is to be tuned divided by the index of refraction of the crystalline material. Wave number, of course, is the reciprocal of wave frequency.

The embodiments of the invention in which an exclusive property or privilege is claimed are defined as follows:

1. In a lead-salt semiconductor diode laser having a PN junction and contiguous laser cavity, the improvement wherein said laser cavity has a non-homogeneous majority current carrier concentration generally normal to said PN junction effective to significantly increase the frequency range within which said laser can be tuned.

2. In a lead-salt semiconductor diode laser having a PN junction and contiguous P-type laser cavity, the improvement wherein said laser cavity has an increasing majority current carrier concentration in a direction extending away from said PN junction effective to increase photon confinement within the laser cavity and widen the frequency range within which said laser can be tuned for single mode operation.

3. In a semiconductor diode laser having a PN junction and a contiguous P-type laser cavity formed in a lead-salt monocrystal, the improvement wherein said PN junction is generally uniformly spaced less than about 20 micrometers from a surface on the monocrystal that is cooled during laser operation, said laser cavity is disposed along said PN junction opposite from said surface, and said laser cavity has a continuously increasing majority current carrier concentration with increasing distance from said PN junction effective to increase the single mode operation frequency range within which said laser body can be tuned.

4. In a homojunction semiconductor diode laser formed in a body of monocrystalline semiconductive material selected from the group consisting of lead-tin telluride and lead-tin selenide and having a generally planar PN junction and a contiguous parallel laser cavity, the improvement wherein said planar PN junction is generally parallelly spaced about 5-15 micrometers from a surface on said laser body that is intended to be cooled during laser operation, said laser cavity is of P-type semiconductor material contiguous said PN junction opposite from said surface and said laser cavity has a majority current carrier concentration that progressively increases with increasing distance from said junction effective to increase photon confinement within the laser cavity, whereby operating temperature and tuning range of the laser body is increased.

5. In a homojunction lead-tin telluride semiconductor diode laser body having a PN junction and a contiguous laser cavity, the improvement wherein said PN junction is planar and generally parallelly spaced less than about 15 micrometers from a surface on said body that is to be cooled during laser operation, said laser cavity is a P-type conductivity region along said PN junction opposite from said surface, and said laser cavity has a majority current carrier concentration that increases continuously with increasing distance in a direction normal to said PN junction within a concentration range of about $10^{18}$–$10^{19}$ carriers per cubic centimeter, whereby frequencies of single mode laser operation are significantly increased.

6. A method of making a more tunable lead-salt diode laser comprising providing a semiconductor lead-salt monocrystal having a one conductivity type portion that progressively increases in majority current carrier concentration inwardly from the monocrystal surface and progressively changes the index of refraction therein, forming a PN junction within said portion generally parallel to said surface to provide an active region for a laser in said monocrystal portion, defining a laser cavity in said active region of said monocrystal portion, and applying electrodes to said monocrystal portion for producing lasing action in said laser cavity.

7. A method of making a lead-tin telluride semiconductor diode laser tunable in single mode operation over a wider band of frequencies comprising the steps of providing a lead-tin telluride semiconductor monocrystal having a P-type surface portion that increases in majority current carrier concentration with increasing depth below said surface from about $10^{18}$ carriers per cubic centimeter at said surface to about $10^{19}$ carriers per cubic centimeter 100–150 micrometers below said surface, diffusing an N-type impurity into said surface portion to form a PN junction and contiguous active laser region that are spaced less than about 20 micrometers below said surface and are parallel to said carrier concentration increases, defining a laser cavity for said active region in said monocrystal portion, and providing ohmic contacts on the monocrystal portion for applying a lasing voltage across said PN junction.

* * * * *